(12) United States Patent
Imai

(10) Patent No.: US 9,159,887 B2
(45) Date of Patent: Oct. 13, 2015

(54) LIGHT-EMITTING DEVICE, LIGHTING DEVICE INCLUDING THE LIGHT-EMITTING DEVICE, AND METHOD OF MANUFACTURING THE LIGHT-EMITTING DEVICE

(71) Applicants: CITIZEN ELECTRONICS CO., LTD.; CITIZEN HOLDINGS CO., LTD., Tokyo (JP)

(72) Inventor: Sadato Imai, Yamanashi-ken (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 14/659,881

(22) Filed: Mar. 17, 2015

(65) Prior Publication Data

US 2015/0194578 A1 Jul. 9, 2015

Related U.S. Application Data

(62) Division of application No. 13/612,078, filed on Sep. 12, 2012, now Pat. No. 9,022,828.

(30) Foreign Application Priority Data

Sep. 21, 2011 (JP) ................. 2011-206011

(51) Int. Cl.
*H05B 33/04* (2006.01)
*H01L 33/50* (2010.01)
*F21V 23/00* (2015.01)
*F21K 99/00* (2010.01)
*F21Y 101/02* (2006.01)

(52) U.S. Cl.
CPC ............... *H01L 33/505* (2013.01); *F21K 9/30* (2013.01); *F21V 23/00* (2013.01); *F21Y 2101/02* (2013.01)

(58) Field of Classification Search
None
See application file for complete search history.

(56) References Cited

U.S. PATENT DOCUMENTS

| 6,774,404 | B2 | 8/2004 | Imai | |
|---|---|---|---|---|
| 2004/0070338 | A1* | 4/2004 | Noguchi et al. | ............ 313/512 |
| 2004/0208210 | A1 | 10/2004 | Inoguchi | |
| 2005/0280018 | A1 | 12/2005 | Imai | |

(Continued)

FOREIGN PATENT DOCUMENTS

| JP | 2005-101283 A | 4/2005 |
|---|---|---|
| JP | 2007-123704 A | 5/2007 |
| JP | 2008258455 A | 10/2008 |

(Continued)

OTHER PUBLICATIONS

Japanese Notification of Reasons for Refusal of Japanese Patent Application No. 2011-206011 issued Jun. 10, 2015 and English translation.

*Primary Examiner* — Ashok Patel
(74) *Attorney, Agent, or Firm* — Browdy and Neimark, P.L.L.C.

(57) ABSTRACT

A light-emitting device includes a light-emitting element with a pair of element electrodes as a first element electrode and a second element electrode positioned at the lower surface of the light-emitting element; a phosphor plate disposed on the upper surface of the light-emitting element; a first resin covering the lower surface and the peripheral side surface of the light-emitting element with the first element electrode and the second element electrode partly appearing from the first resin; and a second resin provided in the phosphor plate.

12 Claims, 13 Drawing Sheets

(56) References Cited

U.S. PATENT DOCUMENTS

| | | |
|---|---|---|
| 2006/0001361 A1 | 1/2006 | Imai et al. |
| 2009/0108283 A1* | 4/2009 | Kadotani et al. ............. 257/98 |
| 2011/0148282 A1 | 6/2011 | Eden et al. |
| 2013/0320380 A1* | 12/2013 | Kanemaru .................... 257/98 |

FOREIGN PATENT DOCUMENTS

| | | |
|---|---|---|
| JP | 2009-152482 A | 7/2009 |
| JP | 2009152482 A | 7/2009 |
| JP | 2010-251807 A | 11/2010 |
| JP | 2011-009572 A | 1/2011 |

\* cited by examiner

LIGHT-EMITTING DEVICE, LIGHTING DEVICE INCLUDING THE LIGHT-EMITTING DEVICE, AND METHOD OF MANUFACTURING THE LIGHT-EMITTING DEVICE

CROSS-REFERENCE TO RELATED APPLICATION

This application is based on and claims the priority benefit of Japanese Patent Application No. 2011-206011, filed on Sep. 21, 2011, the disclosure of which is incorporated herein by reference in its entirety.

BACKGROUND OF THE INVENTION

1. Field of the Invention

The present invention relates to a light-emitting device, a lighting device and an electronic device incorporating the light-emitting device, and a method for manufacturing the light-emitting device, and more particularly, to a light-emitting device including a light-emitting element and including a structure that indicates the arrangement of the anode and the cathode of the electrodes of the light-emitting element.

2. Description of the Related Art

A Light-emitting device (hereinafter referred to as the light-emitting device) including a light-emitting element that is a semiconductor element has been widely used. Such a light-emitting device can achieve a long service life, outstanding driving characteristics, a compact size, and an efficient emission of light, and even can provide vivid emission of light in various colors including white. Due to these features of light-emitting device including a light-emitting element such as a light-emitting diode element (LED element), light-emitting devices including LED elements have been widely used in applications such as backlights for color display devices lamps, lighting tubes or lighting systems. In particular, these days, to cope with reductions in the size of the parts to be mounted on portable devices such as cellular phones or personal digital assistants, there has been an increasing demand for reducing the size of the mounting structure of the light-emitting device to be incorporated into the portable devices.

On the other hand, the light-emitting device having an LED element is known to be constructed in a manner such that the LED element is mounted on a patterned electrode formed on a substrate, and then this LED element is sealed on the upper surface of the substrate with a light-transmitting resin. In the step of mounting this light-emitting device, the polarity of the electrodes of the light-emitting device has to be identified, for example, when the light-emitting device is mounted onto a feed tape, when the light-emitting device is automatically mounted on the motherboard (printed circuit board) of an electronic device onto which the light-emitting device is to be mounted, or when the light-emitting device mounted on the motherboard is visually checked. Accordingly, conventional light-emitting devices are provided with a polarity mark for identifying polarities (for example, FIGS. 1 and 2 in Japanese Patent Application Laid-Open No. 2008-258455, and FIGS. 2 and 3 in Japanese Patent Application Laid-Open No. 2009-152482.)

FIGS. 13 and 14 show a light-emitting device 100 disclosed in FIGS. 1 and 2 in Japanese Patent Application Laid-Open No. 2008-258455. The light-emitting device 100 includes a substrate 110 having a pair of electrodes as an anode electrode 112 and a cathode electrode 111; an LED element 50 disposed with the cathode element electrode of the LED element 50 in contact with the cathode electrode 111 of the substrate 110; a wire 116 connected from the anode element electrode provided on the upper surface of the LED element 50 to the anode electrode 112 of the substrate 110; and a light-transmitting resin 113 that seals the LED element 50.

The cathode electrode 111 and the anode electrode 112 mentioned above extend from the upper surface of the substrate 110 to the lower surface via the side surfaces. Furthermore, the upper surface of the substrate 110 is provided with a pair of polarity marks 115 which are formed, outside the sealing range of the light-transmitting resin 113, by cutting a part of the cathode electrode 111 that is provided on the upper surface of the substrate 110. These polarity marks 115 are intended to be used to identify the orientation of the electrodes when the light-emitting device 100 is mounted on an external motherboard such as of an electronic device. As described above, outside the sealing range of the light-transmitting resin 113, the cathode electrode 111 is provided on the upper surface of the substrate 110 with the polarity marks 115, and thus, it is easier to recognize the orientation of the electrodes.

Furthermore, FIG. 15 shows a light-emitting device 200 disclosed in FIG. 2 in Japanese Patent Application Laid-Open No. 2009-152482. The light-emitting device 200 includes a substrate 210; a cathode electrode 211 and an anode electrode 212 which are formed on the substrate 210; an LED element 50 disposed at the center of the substrate 210; a wire 216a connecting between the cathode element electrode of the LED element 50 and the cathode electrode 211 of the substrate 210; a wire 216b connecting between the anode element electrode of the LED element 50 and the anode electrode 212 of the substrate 210; and a light-transmitting resin 213 for sealing the LED element 50.

The cathode electrode 211 provided on the substrate 210 extends to the lower surface of the substrate 210 via a through-hole 211b and is then electrically connected to a lower surface electrode 211a on the lower surface. Furthermore, the anode electrode 212 provided on the substrate extends to the lower surface of the substrate 210 via a through-hole 212b and is then electrically connected to a lower surface electrode 212a on the lower surface. Furthermore, between the opposing outside surfaces of an optically transparent resin 213 and both the sides of the LED element 50, there are each provided a deep groove 213a that reaches the upper surface of the substrate 210. The wall surface of a reflective white resin 214 filled in the deep groove 213a forms a white reflective frame 214a surrounding the LED element 50. There is also formed a shallow groove 213b in the vicinity of the outside of one of the two deep grooves 213a provided on both the sides of the LED element 50, the groove 213b forming part of the reflective frame 214a, and the shallow groove 213b is filled with the reflective white resin 214 that provides a wall surface 215. The provision of the wall surface 215 enables one to recognize the arrangement of the cathode electrode 211 and the anode electrode 212 on the substrate 210.

However, the aforementioned light-emitting device 100 is configured to have the substrate 110 on which the LED element 50 is mounted and the polarity marks 115 which are provided outside the sealing range of the light-transmitting resin 113 for sealing the LED element 50 on the upper surface of the substrate 110. Thus, although the orientation of the electrodes can be easily recognized when the light-emitting device 100 is mounted on an external board, the size of the substrate 110 becomes larger than the sealing range of the light-transmitting resin 113. This will lead to an increase in the size of the light-emitting device 100 itself and cannot meet the demand for reducing the size of parts.

On the other hand, the aforementioned light-emitting device 200 has the substrate 210 on which the LED element 50 is mounted, and the polarity mark 215 which is formed in the upper surface of the optically transparent resin 213 for sealing the LED element 50 on the upper surface of the substrate 210. Thus, like the light-emitting device 100 mentioned above, the orientation of the electrodes can be identified with ease when the light-emitting device 200 is mounted on an external substrate. However, after the light-emitting device 200 has been completed, this structure requires an extra step of forming the additional shallow groove 213b in the optically transparent resin 213 with the reflective white resin 214 filled in the groove 213b, which is necessary to be disposed outside the white reflective frame 214. Accordingly, the size of the optically transparent resin 213 tends to be larger because of the groove 213b provided outside the white reflective frame 214, and this will lead to an increase in the size of the light-emitting device 200 itself.

SUMMARY OF THE INVENTION

It is therefore an object of the invention to provide a light-emitting device with a structure that indicates the arrangement of the anode and the cathode of the element electrodes of a light-emitting element with the size of the light-emitting device remained as it is.

A light-emitting device according to an embodiment of the present invention includes a light-emitting element that includes an upper surface, a lower surface opposite to the upper surface, a peripheral side surface extending between peripheral edges of the upper surface and peripheral edges of the lower surface, and a pair of element electrodes as a first element electrode and a second element electrode that are positioned at the lower surface opposite to the upper surface of the light-emitting element; a first resin covering the peripheral side surface and the lower surface of the light-emitting element with the first element electrode and the second element electrode of the light-emitting element partly appearing from the first resin; a phosphor plate including an upper surface, a lower surface opposite to the upper surface, a peripheral side surface extending between peripheral edges of the upper surface and peripheral edges of the lower surface, and a groove positioned along one of the peripheral edges of the upper surface of the phosphor plate; and a second resin filled in the groove of the phosphor plate.

In the light-emitting device with this configuration, the lower surface of the phosphor plate may be adhered to the upper surface of the light-emitting element.

The first resin may be white resin, while the second resin may be the same white resin as the first resin.

In another embodiment, the second resin may be made from a resin of different color from the first resin.

In another embodiment, the groove may be positioned adjacent to one of the pair of element electrodes of the light-emitting element in a top plan view. The groove may pass through the phosphor plate from the upper surface to the lower surface of the phosphor plate. Furthermore, the groove may be a line concave groove that is cut into the phosphor plate from the upper surface to a middle of the phosphor plate.

In an embodiment, the upper surface of the phosphor plate is set to be larger in area than the upper surface of the light-emitting element.

Furthermore, in an embodiment, the peripheral side surface of the phosphor plate is flush with a peripheral side surface of the first resin. The groove is positioned above the first resin, which is provided to cover the peripheral side surface of the light-emitting element.

Furthermore, an embodiment of method manufacturing a light-emitting device according to the present invention includes adhering an upper surface of a light-emitting element to a lower surface of a phosphor plate, disposing a first resin on the lower surface of the phosphor plate to cover a peripheral side surface and a lower surface of the light-emitting element with a pair of element electrodes partly appearing from the first resin, forming a groove along one of peripheral edges of the upper surface of the phosphor plate, and filling a second resin in the groove.

As another embodiment of method manufacturing a light-emitting device collectively according to the present invention includes preparing a phosphor plate assembly, adhering upper surfaces of a plurality of light-emitting elements with a space between each of the light-emitting elements to a lower surface of the phosphor plate assembly, disposing a first resin on the lower surface of the phosphor plate assembly to cover a peripheral side surface and a lower surface of each of the light-emitting elements with a pair of electrodes of each of the light-emitting elements partly appearing from the first resin to form an aggregation, forming grooves in the phosphor plate assembly included in the aggregation at positions along one of peripheral edges of the upper surface of each of the phosphor plate assembly adjacent to one of peripheral edges of the upper surface of each of the light-emitting elements, filling a second resin into the grooves in the phosphor plate assembly included in the aggregation, and dicing the aggregation between each of the light-emitting elements to divide the aggregation into a plurality of light-emitting devices.

Also, a phosphor plate assembly including grooves in that a colored resin is disposed can be used for another embodiment of the present invention to manufacture collectively a light-emitting device.

DETAILED DESCRIPTION OF THE EMBODIMENTS

Figure 1:
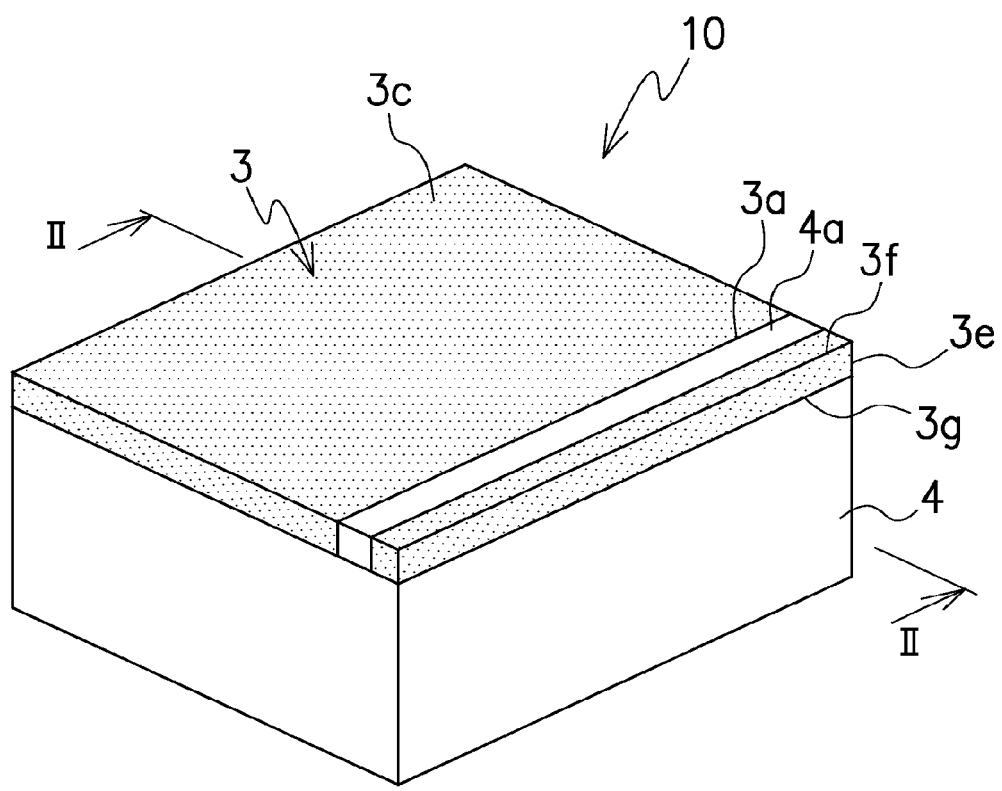
FIG. 1 is a perspective view illustrating a light-emitting device according to a first embodiment of the present invention.

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

A light-emitting device according to embodiments of the present invention including a light-emitting element 1 that includes an upper surface 1c, a lower surface 1d opposite to the upper surface 1c, a peripheral side surface 1e extending between peripheral edges 1f of the upper surface 1c and peripheral edges 1g of the lower surface 1d and a pair of element electrodes as a first element electrode 1a and a second element electrode 1b that are positioned at the lower surface 1d opposite to the upper surface 1c of the light-emitting element 1, a first resin 4 that covers the peripheral side surface 1e and the lower surface 1d of the light-emitting element 1 with the first element electrode 1a and the second element electrode 1b of the light-emitting element 1 partly appearing from the first resin 4, a phosphor plate 3 that includes an upper surface 3c, a lower surface 3d opposite to the upper surface 3c, a peripheral side surface 3e extending between peripheral edges 3f of the upper surface 3c and peripheral edges 3g of the lower surface 3d, and a groove 3a positioned along one of the peripheral edges 3f of the upper surface 3c of the phosphor plate 3, and a second resin 4a filled in the groove 3a of the phosphor plate 3. The lower surface 3d of the phosphor plate 3 is adhered to the upper surface 1c of the light-emitting element 1.

[First Embodiment]

Figure 2:
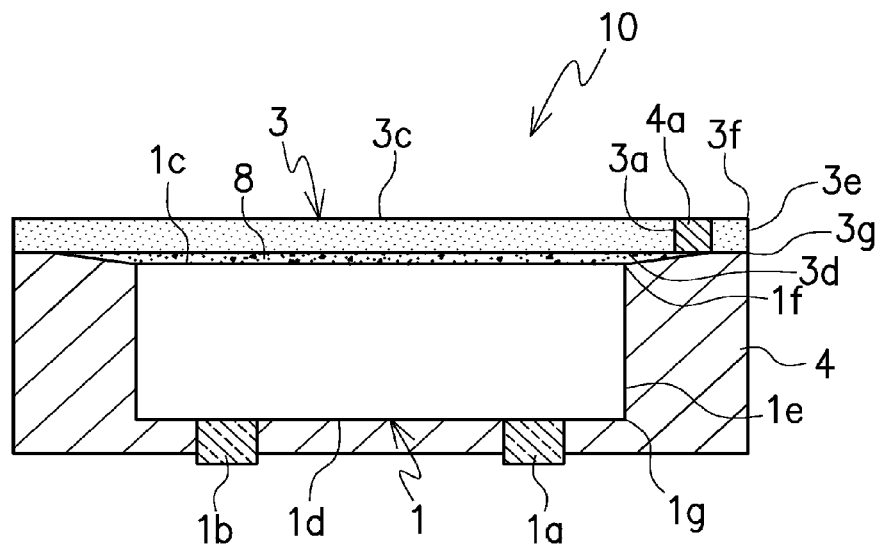
FIG. 2 is a cross-sectional view illustrating the light-emitting device taken along line II-II of FIG. 1.
Figure 3:
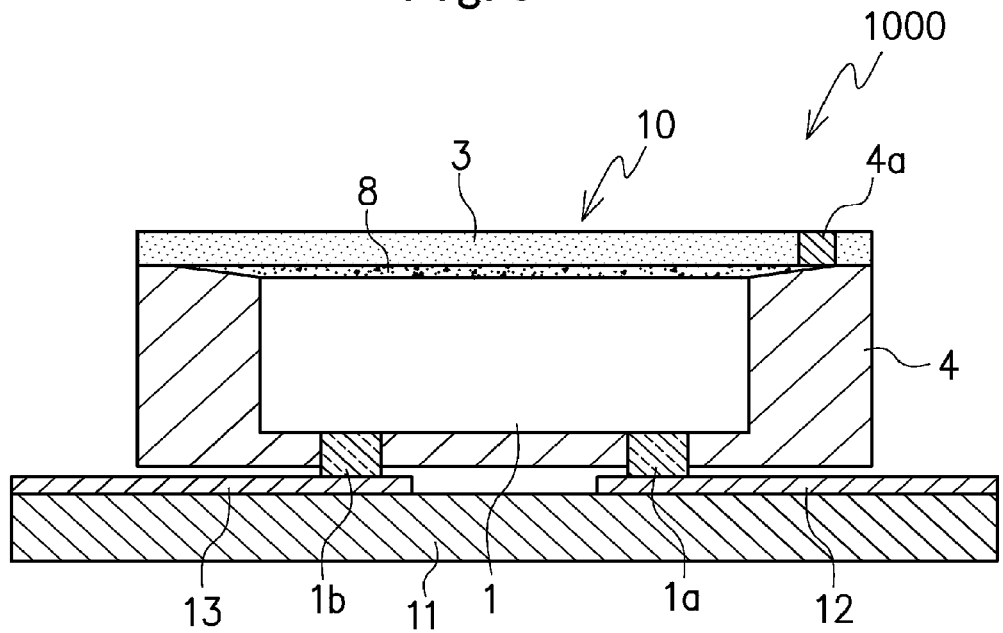
FIG. 3 is a cross-sectional view illustrating the light-emitting device of FIG. 1 mounted on a motherboard such as of an electronic device or a lighting device.

FIGS. 1 to 3 show a light-emitting device according to a first embodiment of the present invention, and more particularly, a light-emitting device 10 incorporating a light-emitting element. The light-emitting device 10 includes, on the lower surface of the light-emitting device, a pair of element electrodes as a first element electrode 1a and a second element electrode 1b partly appearing from a first resin 4 that seals the lower surface of the light-emitting element 1. As used herein, the expression "a pair of element electrodes partly appearing" includes the case where the lower surface of the first element electrode 1a, the lower surface of the second element electrode 1b, and the lower surface of the first resin 4 are flush with each other, and the case where a lower portion of the first element electrode 1a and a lower portion of the second element electrode 1b are protruded from the lower surface of the first resin 4.

The light-emitting device 10 includes a phosphor plate 3 placed on an upper surface 1c, through which the light-emitting element 1 emits light, and the phosphor plate 3 may be adhered to the upper surface 1c of the light-emitting element 1 with a transparent adhesive 8; and white resin as the first resin 4 covering a peripheral side surfaces 1e of the light-emitting element 1 and a lower surface 1d of the light-emitting element 1 other than the first element electrode 1a and the second element electrode 1b. Note that the phosphor plate 3 is formed in the shape of a plate with a fluorescent agent which is included or dispersed in a transparent resin or translucent resin to shift the wavelength of at least part of light from the light-emitting element. The white resin is composed of white pigment such as titanium oxide in a resin.

Furthermore, on an upper surface 3c of the phosphor plate 3, there is formed a straight groove 3a along one side edge which is one of peripheral edges 3f of the upper surface 3c of the phosphor plate 3 near one of the pair of element electrodes of the light-emitting element 1, i.e., the first element electrode 1a in a top plan view. The groove 3a is filled with a second resin 4a. If the groove 3a provided in the phosphor plate 3 is positioned above the first resin 4 which is necessary to cover the peripheral side surface 1e of the light-emitting element 1, the groove 3a shown in embodiments of the present invention can prevent the size of light-emitting device from increasing. Also, as the groove 3a disposed above the first resin 4, the groove 3a does not block light emitted from the upper surface 1c of the light-emitting element 1. The second resin 4a filled in the groove 3a indicates that the one of the element electrodes or the first element electrode 1a is the cathode electrode. As shown in FIG. 2, the second resin 4a filled in the groove 3a of the phosphor plate 3 indicates the position of the anode and the cathode of the element electrodes, which are readily recognized from above the light-emitting device 10. For example, even after the light-emitting device 10 according to this embodiment of the present invention is mounted on the motherboard of an electronic device or a lighting device, it is possible to readily identify which side is the anode or the cathode. Note that the second resin 4a is expected to be colored one other than a colorless transparent resin; however, since the color is not limited to a particular type, the white resin used for the first resin 4 may also be employed as the second resin 4a.

When a light-emitting device according to embodiments of the present invention is used in a lighting device including a motherboard, and the light-emitting device is disposed on the mother board of the lighting device. The motherboard of the lighting device includes a pair of electrodes as a first electrode and a second electrode. The first element electrode of the light-emitting element may be electrically connected to the first electrode of the motherboard and the second element electrode of the light-emitting element may be electrically connected to the second electrode of the motherboard.

As shown in FIG. 3, to mount the light-emitting device 10 onto a motherboard 11 such as of an electronic device or a lighting device 1000, a motherboard 11 including a pair of electrodes as a first electrode 12 and a second electrode 13; the first element electrode 1a of the light-emitting element 1 is in contact with the first electrode 12 of the motherboard 11 and the second element electrode 1b of the light-emitting element 1 is in contact with connected to the second electrode 13 of the motherboard 11 for electrical connection.

The line of the second resin 4a running through the phosphor plate 3 or the upper surface of the light-emitting device 10 can serve as a mark with respect to a cathode conductor trace 12 as a first electrode and an anode conductor trace 13 as a second electrode which are provided on the motherboard 11. One of the element electrodes or the first element electrode 1a as the cathode electrode and the second element electrode 1b as the anode electrode can be aligned with the cathode conductor trace 12 as the first electrode of the motherboard 11 and the anode conductor trace 13 as the second electrode of the motherboard 11, respectively. It is thus possible to easily mount the light-emitting device 10 according to this embodiment of the present invention onto the motherboard 11 of the electronic device or the lighting device 1000. Furthermore, even after the light-emitting device 10 has been mounted onto the motherboard 11, it is possible to view the light-emitting device 10 from above to recognize on which side the anode electrode is located and on which side the cathode electrode is located.

In the light-emitting device 10 according to this embodiment of the present invention, the light-emitting element 1 illustrated is an LED element. Since no substrate is required to mount the light-emitting element 1 thereon, the light-emitting device 10 can be reduced in size.

Note that the upper surface 3c of the phosphor plate 3 is set to be larger in area than the upper surface 1c of the light-emitting element 1, but a peripheral side surface of the phosphor plate is flush with the peripheral side surface of the first resin 4 that is provided on the peripheral side surface 1e and a lower surface 1d of the light-emitting element 1. The first element electrode 1a and the second element electrode 1b of the light-emitting element 1 partly appear from the first resin 4.

Now, a method for manufacturing the aforementioned light-emitting device 10 according to a first embodiment includes: adhering an upper surface of a light-emitting element to a lower surface of a phosphor plate, disposing a first resin on the lower surface of the phosphor plate to cover a peripheral side surface and a lower surface of the light-emitting element with a pair of element electrodes partly appearing from the first resin, forming a groove along one of peripheral edges of the upper surface of the phosphor plate, and filling a second resin in the groove.

A manufacturing method according to a second embodiment of the present invention includes: preparing a phosphor plate assembly 8, adhering upper surfaces 1c of a plurality of light-emitting elements 1 with a space between each of the light-emitting elements 1 to a lower surface 3d of the phosphor plate assembly 3, disposing a first resin 4 on the lower surface 3d of the phosphor plate assembly 3 to cover a peripheral side surface 1e and a lower surface 1d of each of the light-emitting elements 1 with a pair of element electrodes 1a, 1b of each of the light-emitting elements partly appearing from the first resin to form an aggregation 10L, forming grooves 3a in the phosphor plate assembly 3L included in the aggregation 10L at positions along one of peripheral edges 3f of the upper surface 3c of the phosphor plate assembly 3L adjacent to one of peripheral edges 3f of the upper surface 3c of each of light-emitting elements 1, filling a second resin 4 into the grooves 3a in the phosphor plate assembly 3L included in the aggregation 10L, and dicing the aggregation between each of the light-emitting elements to divide the aggregation 10L into a plurality of light emitting devices 10.

FIGS. 4A to 4F illustrate manufacturing steps for manufacturing the light-emitting device 10 in volume at a time by forming an aggregation 10L of a plurality of light-emitting devices 10 using the aforementioned large phosphor plate assembly 3L and then finally dividing the aggregation 10L.

Figure 4A:
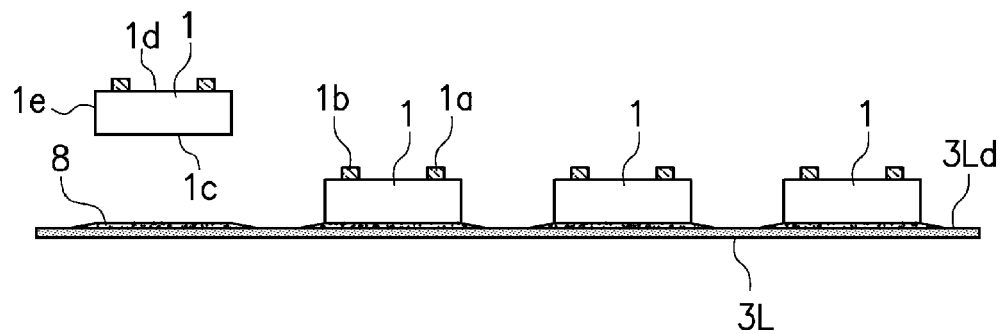
FIGS. 4A to 4F are process diagrams showing a first method for manufacturing the light-emitting device of FIG. 1.

FIG. 4A illustrates a step of adhering a plurality of light-emitting elements 1 to the phosphor plate assembly 3L. In the step, the large phosphor plate assembly 3L is prepared; a plurality of light-emitting elements 1 are placed on the phosphor plate assembly 3L at predetermined intervals with the light emission surface oriented downward; and the upper surface as a light emission surface of each of the light-emitting elements 1 is then adhered the phosphor plate assembly 3L with the transparent adhesive 8. The upper surface 1c of the plurality of light-emitting elements 1 are adhered to the lower surface 3Ld of the phosphor plate assembly 3L, while the lower surface 1d of the respective light-emitting elements 1 opposite to the upper surface 1c of the light-emitting element 1 has the first element electrode 1a and the second element electrode 1b protruded therefrom.

Figure 4B:
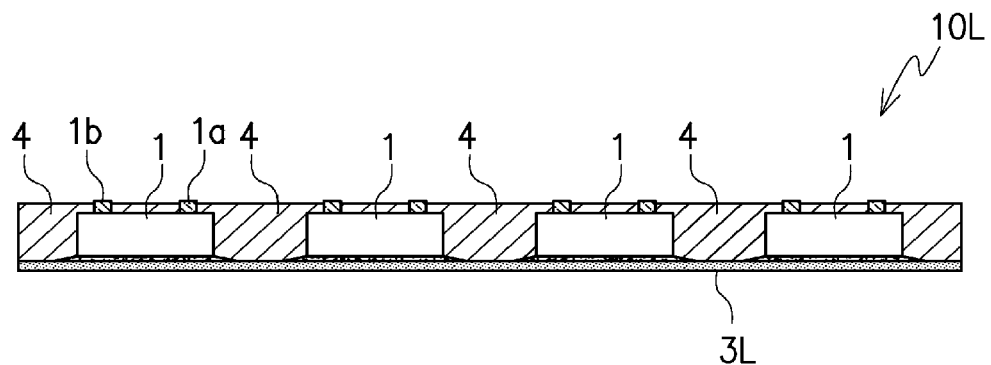

FIG. 4B shows a first resin filling step. In this manufacturing step, white resin or the first resin 4 is filled in between the plurality of light-emitting elements 1 adhered to the phosphor plate assembly 3L at predetermined intervals, whereby the side surfaces 1e and the lower surface 1d of each of the light-emitting elements 1 are coated with the white resin. Note that the peripheral side surface 1e and the lower surface 1d of each of the light-emitting elements 1 are coated with the first resin 4, which may be a white resin. The lower surface 1d of each of the light-emitting elements 1 is coated by the first resin 4 with the first element electrode 1a and the second element electrode 1b protruded from the first resin 4. The first element electrode 1a and the second element electrode 1b are exposed from the first resin 4 at the lower surface 1d of each of the light-emitting elements 1.

Figure 4C:
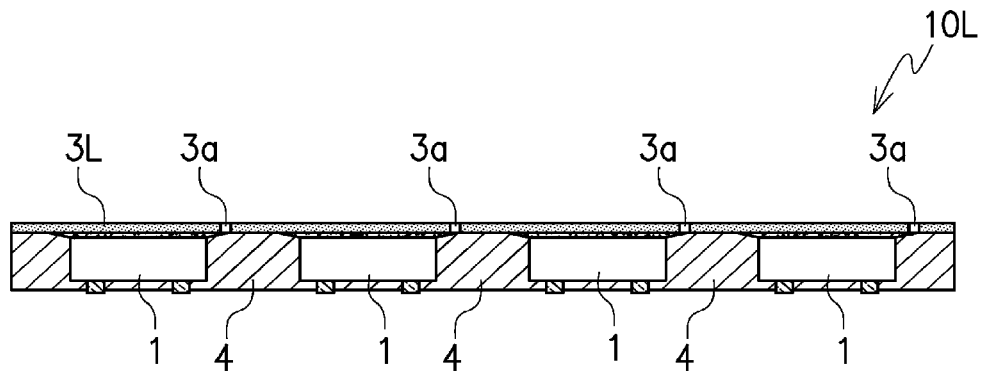

FIG. 4C illustrates a groove formation step of forming a groove in the phosphor plate assembly. In this manufacturing step, a plurality of grooves 3a are formed each at a predetermined position of the phosphor plate assembly 3L. The predetermined position in this embodiment refers to a position near the first element electrode 1a on the cathode side in a top plan view, among the pair of element electrodes provided on each of the light-emitting elements 1 as the first element electrode 1a and the second element electrode 1b. As an example, the position is at an end portion within the region of the adhesive 8 used to adhere each of the light-emitting elements 1 to the phosphor plate assembly 3L (see FIG. 1). Furthermore, the groove 3a is formed also as a hole that penetrates through the phosphor plate assembly 3L from the upper surface to the lower surface.

Figure 4D:
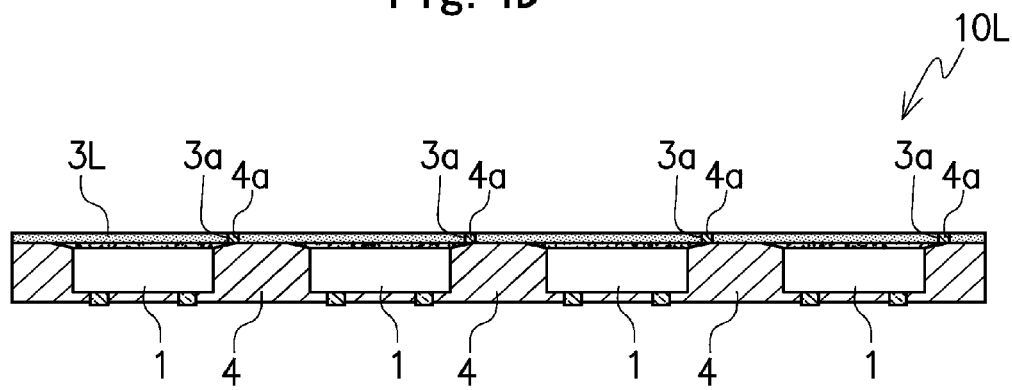

FIG. 4D illustrates a second resin filling step. In this manufacturing step, a colored resin as the second resin 4a is filled in each groove 3a formed in the phosphor plate assembly 3L. To allow one to recognize the position and orientation of the first element electrode 1a and the second element electrode 1b by the placement of the second resin 4a, the resin desirably has a color that provides good visibility. The resin is not limited to a particular one so long as the resin is not a transparent one but has a visible color. For example, the white resin employed in the first resin filling step can also be used as the second resin 4a.

Figure 4E:
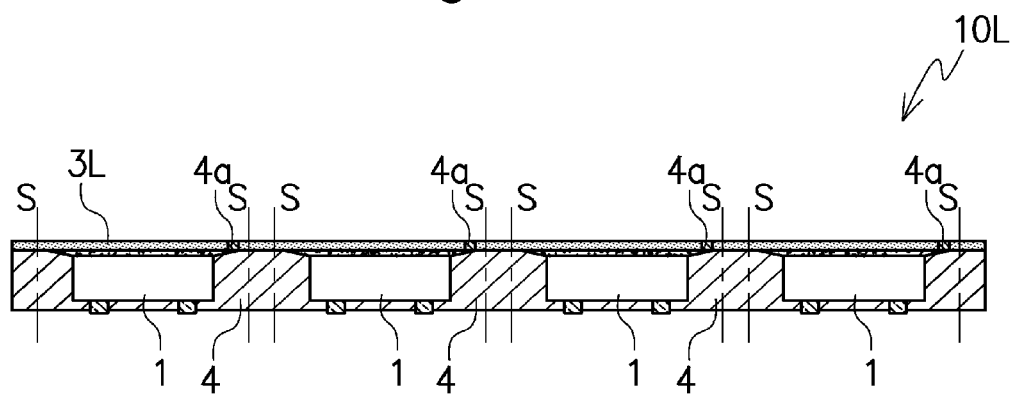

FIG. 4E illustrates a cutting and separating step. In this manufacturing step, as shown in FIG. 4E, cutting means such as a scriber is used to cut the phosphor plate assembly 3L along cutting lines S shown thereon at predetermined intervals (at an intermediate portion between each of the light-emitting elements 1 disposed on the phosphor plate assembly 3L).

Figure 4F:
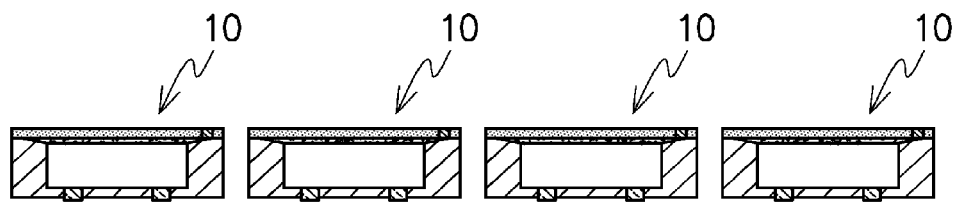

FIG. 4F shows completed individual light-emitting devices 10 which have been obtained by dividing the phosphor plate assembly 3L into each light-emitting element 1 in the cutting and separating step to produce in volume the individual light-emitting device 10 shown in FIG. 1.

According to the aforementioned manufacturing method, a plurality of light-emitting elements 1 are arrayed at predetermined intervals on the phosphor plate assembly 3L as a base; the first resin 4 is filled therebetween to seal the light-emitting elements 1; the groove 3a is provided in each of the light-emitting elements 1; and after that, the light-emitting elements 1 are cut into individual ones. This can achieve mass-production of small light-emitting devices with the light emission surface or the upper surface 1c of the light-emitting element 1 covered with the phosphor plate 3 that is less in thickness than the light-emitting element 1, while the side surfaces 1e of the light-emitting element 1 are covered with the first resin 4 that is greater in thickness than the phosphor plate 3 but less in thickness than the light-emitting element 1. The phosphor plate 3 can also be easily provided with the second resin 4a which is filled in the groove as the mark for indicating the position and orientation of polarity. It is thus possible to produce in volume small light-emitting devices of which polarity is readily identified.

A description will next be made to a second method for manufacturing the aforementioned light-emitting device 10 with reference to FIGS. 5A to 5E.

The manufacturing method of this embodiment includes: preparing a phosphor plate assembly 3L including grooves 3a provided with a space between each of the grooves 3a; and adhering upper surfaces 1c of a plurality of light-emitting elements 1 adjacent to the grooves 3a with a space between each of the light-emitting elements 1, to a lower surface 3d of the phosphor plate assembly 3L.

Furthermore, the manufacturing method of this embodiment includes: disposing a first resin 4 on the lower surface 3Ld of the phosphor plate assembly 3L to cover a peripheral side surface 1e and a lower surface 1d of each of the light-emitting elements 1 with a pair of element electrodes 1a, 1b of each of the light-emitting elements 1 partly appearing from the first resin 4 to form an aggregation 10L, filling a second resin 4a into the grooves 3a in the phosphor plate assembly 3L included in the aggregation 10L.

Since this manufacturing method is similar to the manufacturing method described in relation to FIGS. 4A to 4F, like reference numbers refer to like components, and the same steps will be described only concerning the difference in step number and will not be repeatedly explained.

Figure 5A:
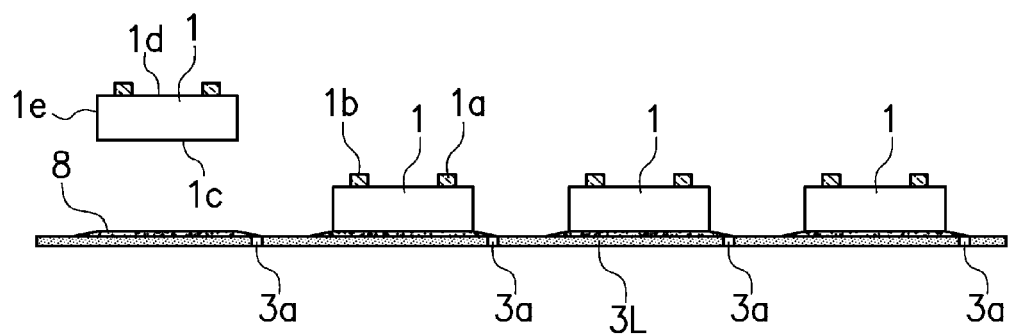
FIGS. 5A to 5E are process diagrams showing a second method for manufacturing the light-emitting device of FIG. 1.

FIG. 5A shows a step of adhering the light-emitting element 1 to the phosphor plate assembly 3L; however, unlike in FIG. 4A, prepared is a phosphor plate assembly 3L which is provided in advance with a plurality of grooves 3a. Like in the manufacturing method described above, a plurality of light-emitting elements 1 are adhered to the phosphor plate assembly 3L with the transparent adhesive 8 at predetermined intervals.

Figure 5B:
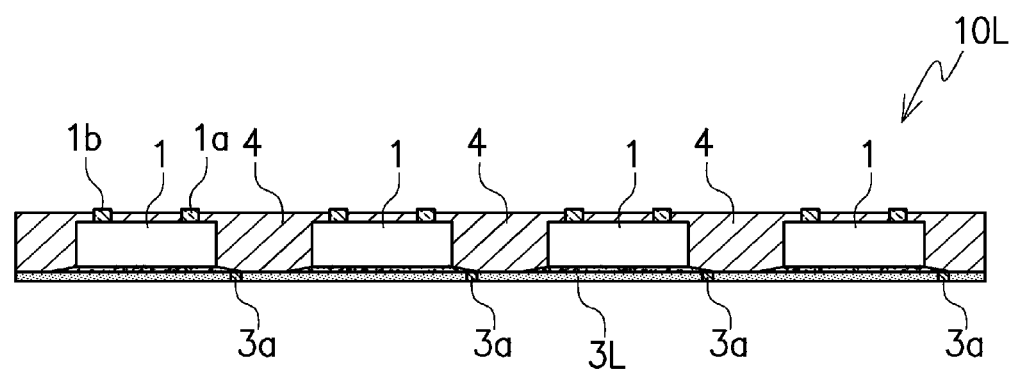
Figure 5C:
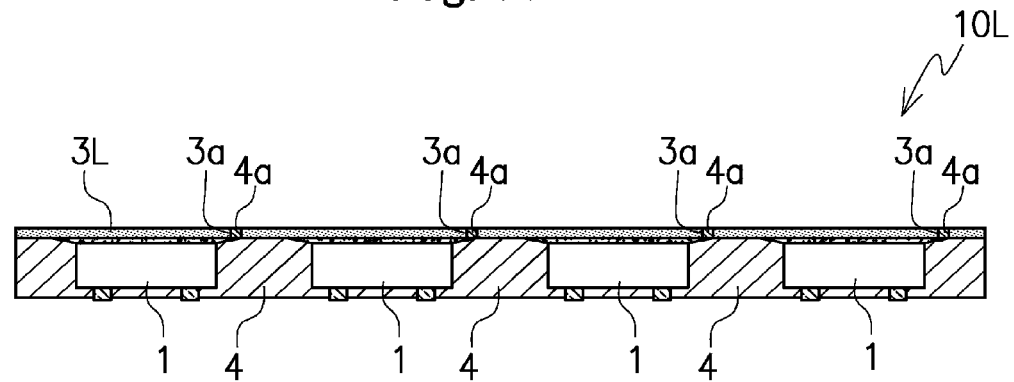
Figure 5D:
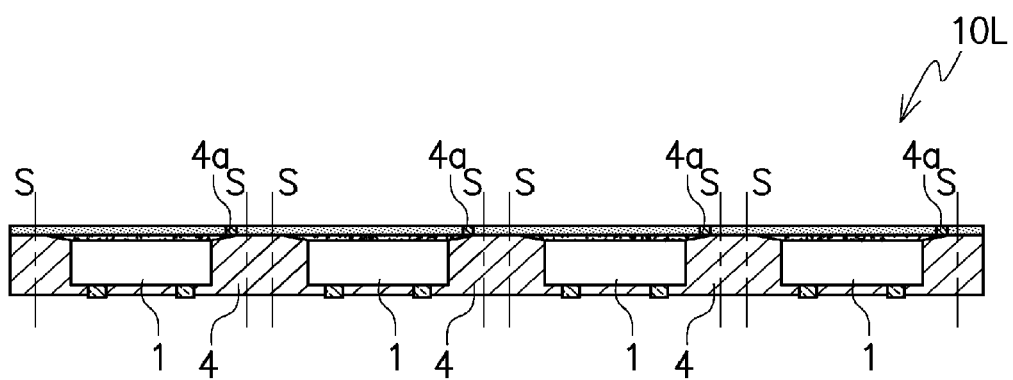
Figure 5E:
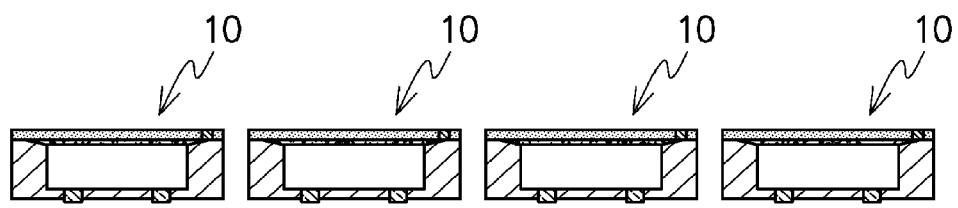

Since the first resin filling step for sealing the light-emitting elements 1 shown in FIG. 5B, the second resin filling step for structuring as shown in FIG. 5C, and the cutting and separating step shown in FIG. 5D are generally the same as the respective steps in FIGS. 4B, 4D, and 4E, detailed descriptions will not be made thereto. Through these steps, the individual light-emitting devices 10 as shown in FIG. 5E will be produced in volume.

In the aforementioned manufacturing method, a plurality of grooves 3a can be formed in advance in the phosphor plate assembly 3L, thereby eliminating the groove formation step that is performed halfway in the process as shown in FIG. 4C.

FIGS. 6A to 6D show a third method for manufacturing the aforementioned light-emitting device 10. Since this method for manufacturing the light-emitting device 10 is substantially similar to the second manufacturing method described with reference to FIGS. 5A to 5E, like reference numbers refer to like components, and the same steps will be described only concerning the difference in step number and will not be repeatedly explained.

Figure 6A:
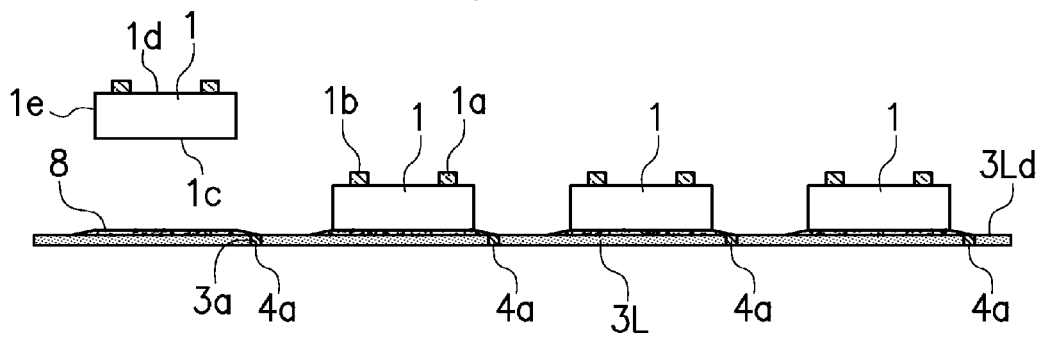
FIGS. 6A to 6D are process diagrams showing a third method for manufacturing the light-emitting device of FIG. 1.

FIG. 6A shows a step of adhering a plurality of light-emitting elements 1 to the phosphor plate assembly 3L. Like in FIG. 5A, prepared is a phosphor plate assembly 3L which is provided in advance with a plurality of grooves 3a, and the grooves 3a in the prepared phosphor plate assembly 3L are filled with a colored resin as the second resin 4a to visually identify lines more easily. The plurality of light-emitting elements 1 are adhered with the transparent adhesive 8 to the phosphor plate assembly 3L with the plurality of grooves 3a already filled with the second resin 4a.

Figure 6B:
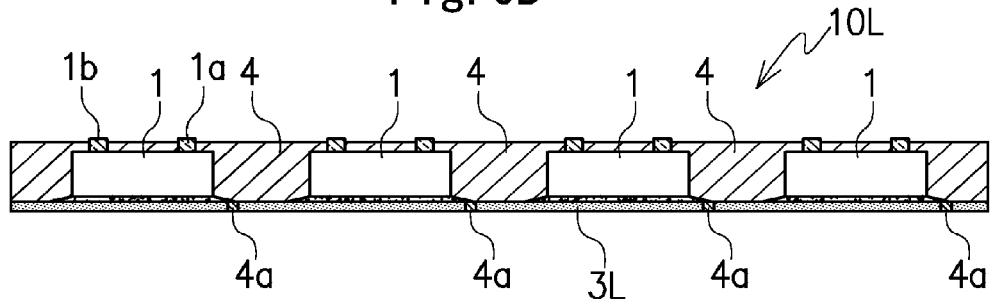
Figure 6C:
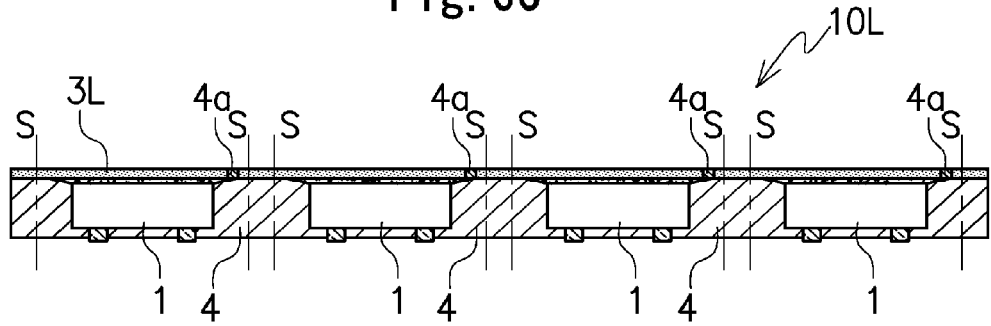
Figure 6D:
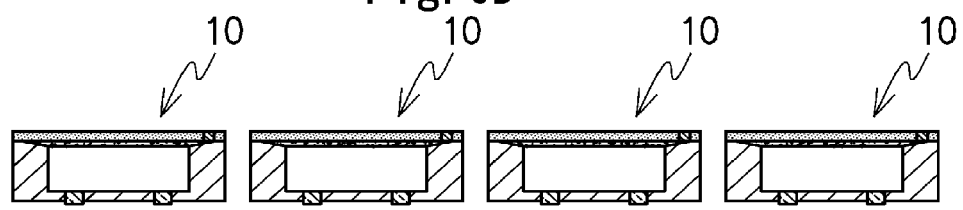

Since the first resin filling step of FIG. 6B for sealing the light-emitting elements 1 and the cutting and separating step of FIG. 6C are generally the same as the respective steps in FIGS. 5B and 5D above, no detailed descriptions will be made thereto. Through these steps, the light-emitting devices 10 as shown in FIG. 6D will be produced in volume. In the aforementioned manufacturing method, by preparing the phosphor plate assembly 3L with a plurality of grooves 3a filled in advance with the second resin 4a, the second resin filling step shown in FIG. 5C can be eliminated in the manufacturing process.

As described above, in the step of adhering the light-emitting element 1 in the second manufacturing method and the third manufacturing method, prepared is the phosphor plate assembly 3L which is already provided with the grooves 3a or which has the grooves 3a filled with the first resin 4. This can simplify the manufacturing process for the light-emitting device 10 by eliminating part thereof.

[Second Embodiment]

Figure 7:
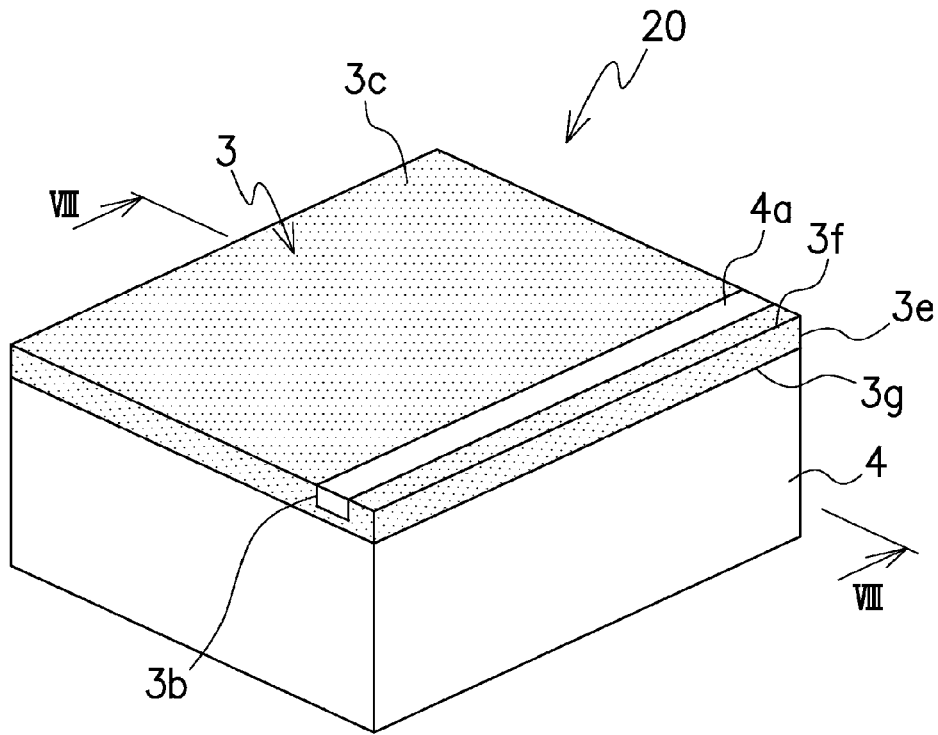
FIG. 7 is a perspective view illustrating a light-emitting device according to a second embodiment of the present invention.
Figure 8:
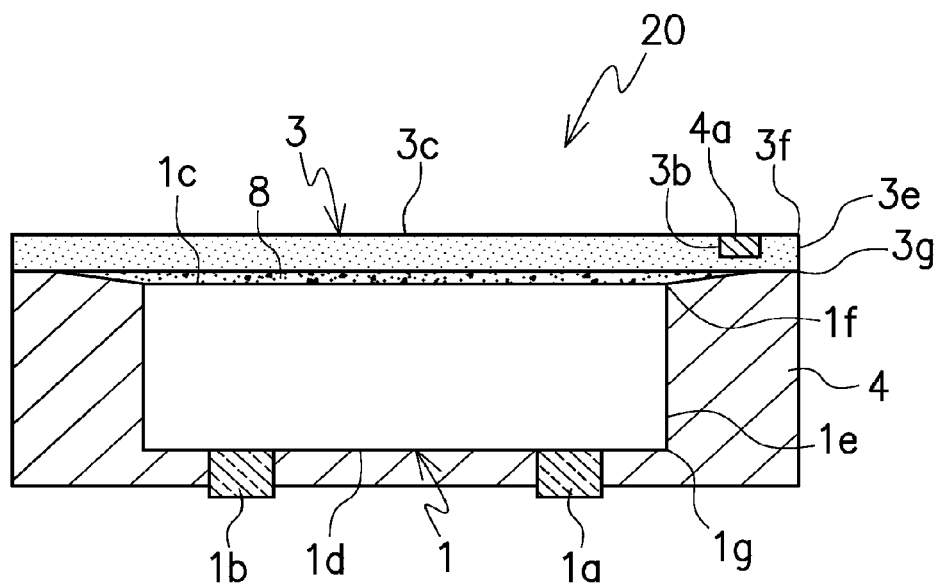
FIG. 8 is a cross-sectional view taken along line VIII-VIII of FIG. 7.

FIGS. 7 and 8 illustrate a light-emitting device according to a second embodiment of the present invention. Like the light-emitting device 10 according to the first embodiment described above, this light-emitting device 20 includes a light-emitting element 1 which has on the lower surface 1d a pair of element electrodes as the first element electrode 1a and the second element electrode 1b; a phosphor plate 3 for covering the upper surface 1c or the light emission surface of the light-emitting element 1; and a white resin or a first resin 4 for covering the side surfaces 1e of the light-emitting element 1 and the lower surface 1d of the light-emitting element 1 other than the pair of element electrodes as the first element electrode 1a and the second element electrode 1b. Furthermore, the upper surface 3c of the phosphor plate 3 is provided with a straight groove 3b formed along the peripheral edge 3f in the vicinity of the first element electrode 1a of the light-emitting element 1 and the groove 3b is filled with the second resin 4a; however, the shape of the groove 3b formed in the phosphor plate 3 is different from the groove 3a of the light-emitting device 10 according to the first embodiment.

That is, while the light-emitting device 10 according to the first embodiment has the groove 3a which is formed as a hole penetrating through the phosphor plate 3 from the upper surface to the lower surface, the LED light-emitting device 20 according to this embodiment has the groove 3b which is formed as a line concave groove that is cut into the phosphor plate 3 from the upper surface 3c to a middle of the phosphor plate 3. Since the groove 3b does not penetrate to the lower surface of the phosphor plate 3, the phosphor plate 3 can be provided with an increased strength.

FIGS. 9A to 9D illustrate a method for manufacturing the light-emitting device 20. In this embodiment, the method includes: preparing a phosphor plate assembly 3L including grooves 3b provided with a space between each of the grooves 3b in that a colored resin 4a filled, adhering upper surfaces 1c of a plurality of light-emitting elements 1 adjacent to the grooves 3b in that the colored resin 4a filled, with a space between each of the light-emitting elements 1, to a lower surface 3d of the phosphor plate assembly 3L, disposing a white resin 4 on the lower surface 3Ld of the phosphor plate assembly 3L to cover a peripheral side surface 1e and a lower surface 1d of each of the light-emitting elements 1 with a pair of element electrodes 1a, 1b of each of the light-emitting elements 1 partly appearing from the white resin 4 to form an aggregation 20L; and dicing the aggregation 20L between each of the light-emitting elements 1 to divide the aggregation 20L into a plurality of light emitting devices 20.

Figure 9A:
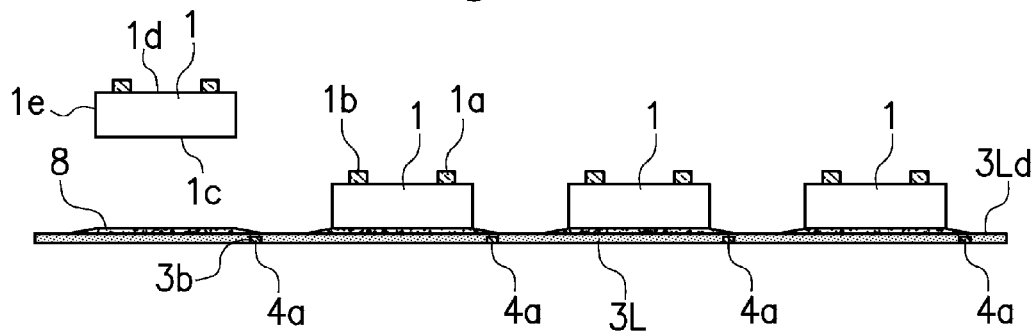
FIGS. 9A to 9D are process diagrams showing a method for manufacturing the light-emitting device of FIG. 7.
Figure 9B:
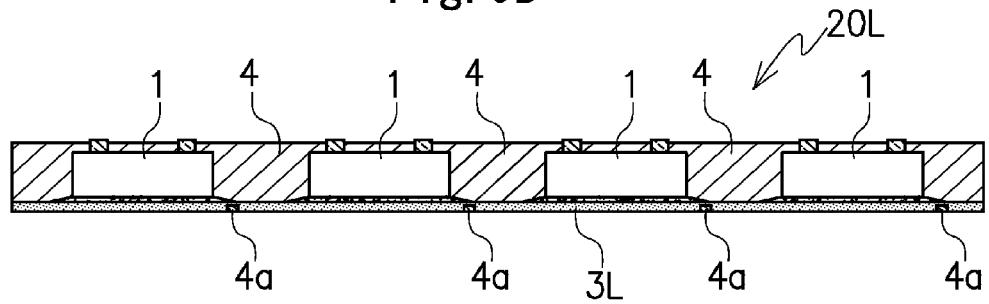
Figure 9C:
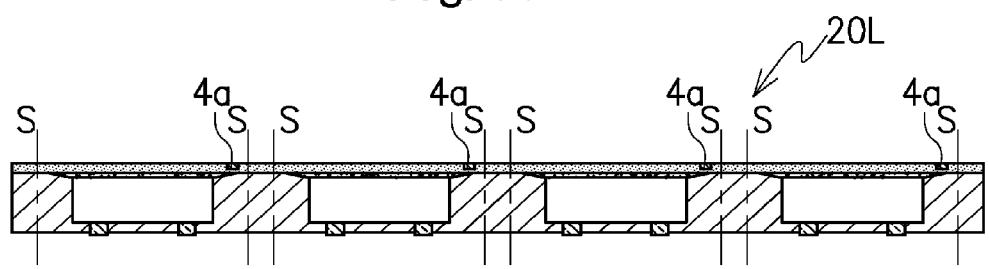
Figure 9D:
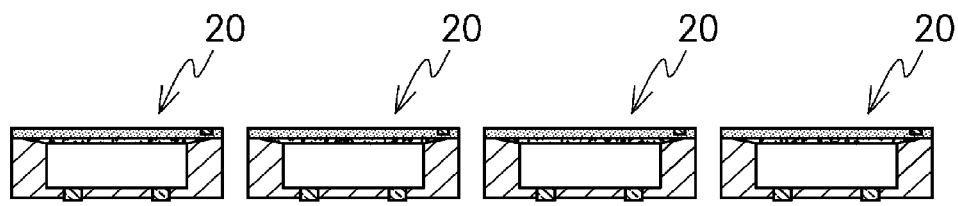

This manufacturing method is generally the same as the method for manufacturing the light-emitting device 10 illustrated in FIG. 6A to FIG. 6D. In the adhering step shown in FIG. 9A, prepared is the phosphor plate assembly 3L with a plurality of grooves 3b filled with the second resin 4a, and then upper surfaces of the plurality of light-emitting elements 1 are adhered to a lower surface 3Ld of the phosphor plate assembly 3L with the transparent adhesive 8. Note that the first resin filling step for sealing the light-emitting element 1 of FIG. 9B and the cutting and separating step of FIG. 9C are generally the same as the respective steps of FIGS. 6B and 6D above, and thus no detailed descriptions will be made thereto. Through these steps, the individual light-emitting devices 20 as shown in FIG. 9D are produced in volume.

[Third Embodiment]

Figure 10:
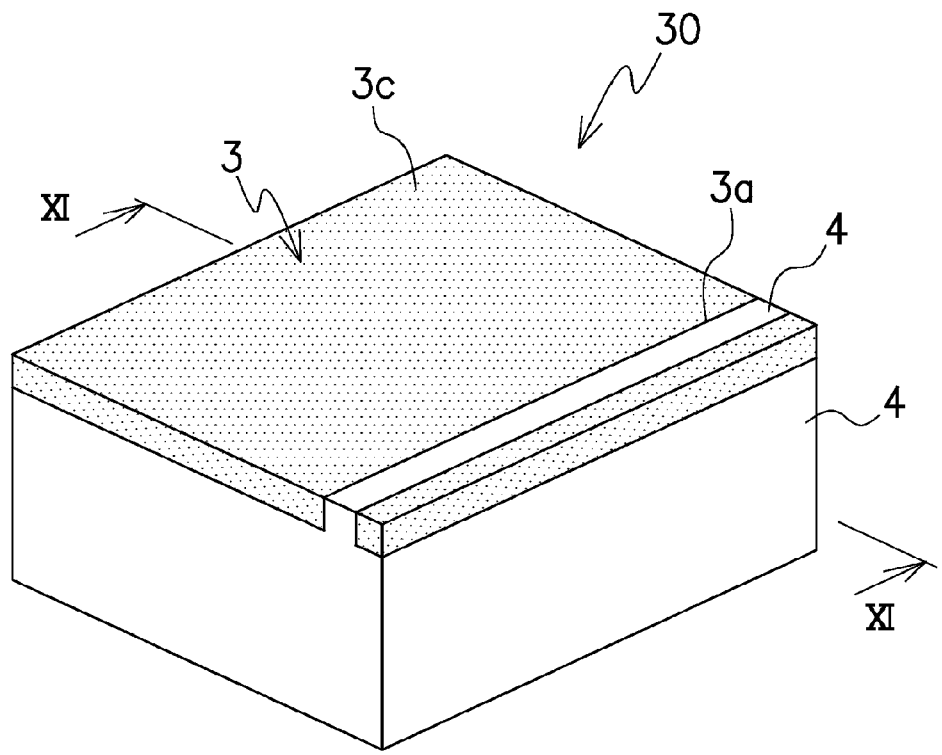
FIG. 10 is a perspective view illustrating a light-emitting device according to a third embodiment of the present invention.
Figure 11:
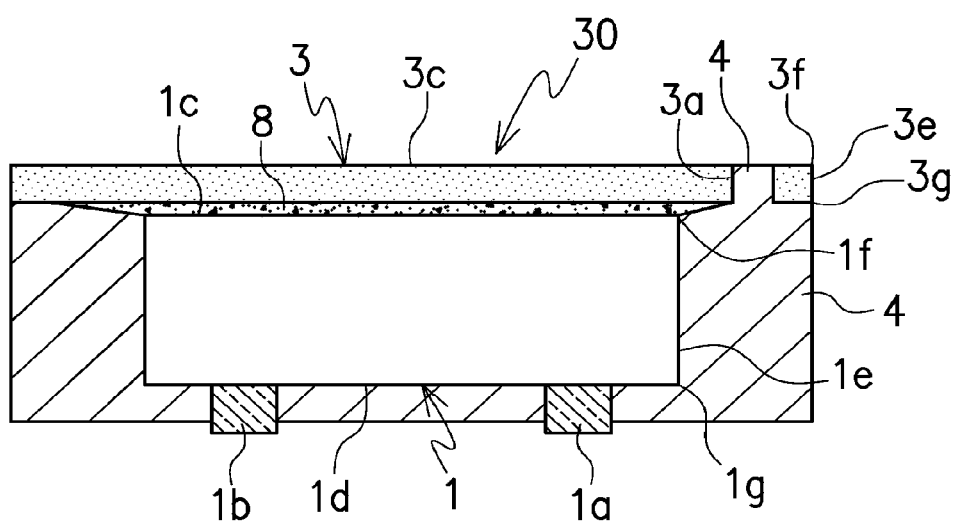
FIG. 11 is a cross-sectional view taken along line XI-XI of FIG. 10.

FIGS. 10 and 11 illustrate a light-emitting device according to a third embodiment of the present invention. Like the light-emitting device 10 according to the first embodiment described above, this light-emitting device 30 includes the light-emitting element 1 having the first element electrode 1a and the second element electrode 1b on the lower surface 1d; the phosphor plate 3 for covering the upper surface 1c through which the light-emitting element 1 emits light; and white resin as the first resin 4 for covering the side surfaces 1e of the light-emitting element 1 and the lower surface 1d of the light-emitting element 1 excluding a pair of element electrodes as the first element electrode 1a and the second element electrode 1b. Furthermore, the upper surface 3c of the phosphor plate 3 is provided with a straight groove 3a formed along the peripheral edge 3f in the vicinity of one of the electrodes of the light-emitting element 1 or the first element electrode 1a, and a colored resin as the second resin 4a is filled in the groove 3a.

The light-emitting device 30 may be configured with the groove 3a provided in the phosphor plate 3 according to the first embodiment. The groove 3a provided in the phosphor plate 3 may be formed as a hole that penetrates through the phosphor plate 3 from the upper surface to the lower surface. A colored resin may be filled in the hole. As shown in FIGS. 10 and 11, the first resin 4 that seals the lower surface 1d and the peripheral side surface of the light-emitting element 1 may be used as a colored resin filled in the groove 3a.

FIGS. 12A to 12D illustrate a method for manufacturing the light-emitting device 30. The manufacturing method of this embodiment includes: preparing a phosphor plate assembly 3L including grooves 3a provided with a space between each of the grooves 3a; and adhering upper surfaces 1c of a plurality of light-emitting elements 1 adjacent to the grooves 3a with a space between each of the light-emitting elements 1, to a lower surface 3d of the phosphor plate assembly 3L.

Figure 12A:
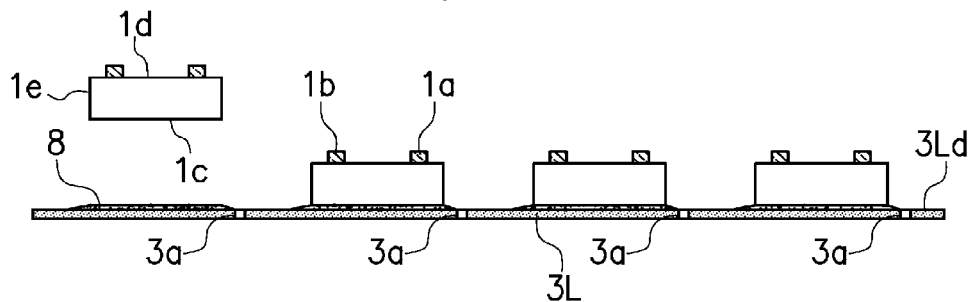
FIGS. 12A to 12D are process diagrams showing a method for manufacturing the light-emitting device of FIG. 10.
Figure 12B:
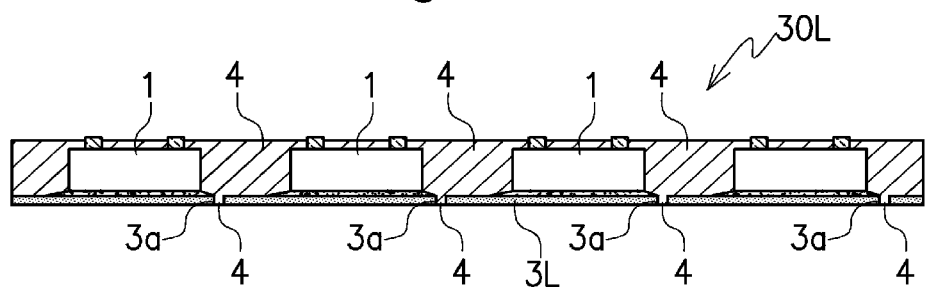
Figure 12C:
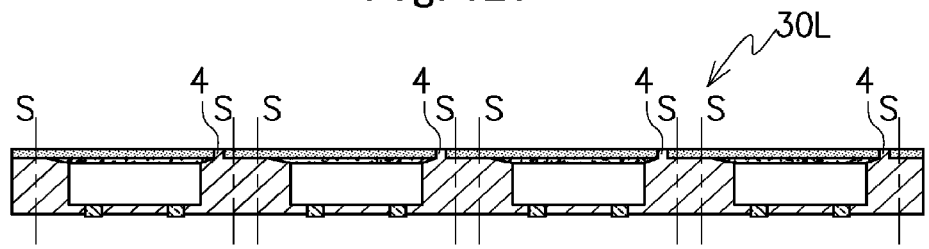
Figure 12D:
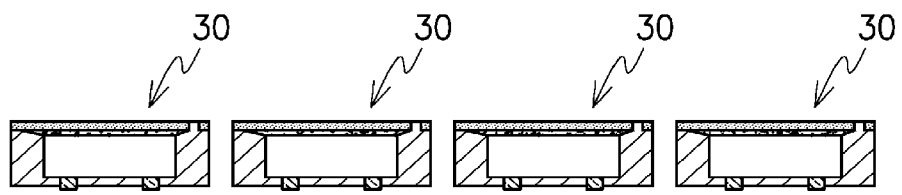
Figure 13:
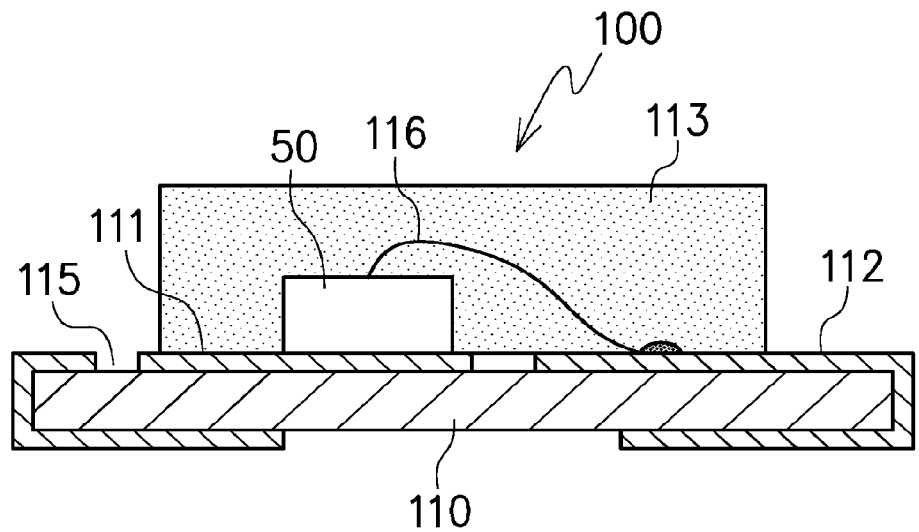
FIG. 13 is a cross-sectional view illustrating a light-emitting device according to a conventional technique.
Figure 14:
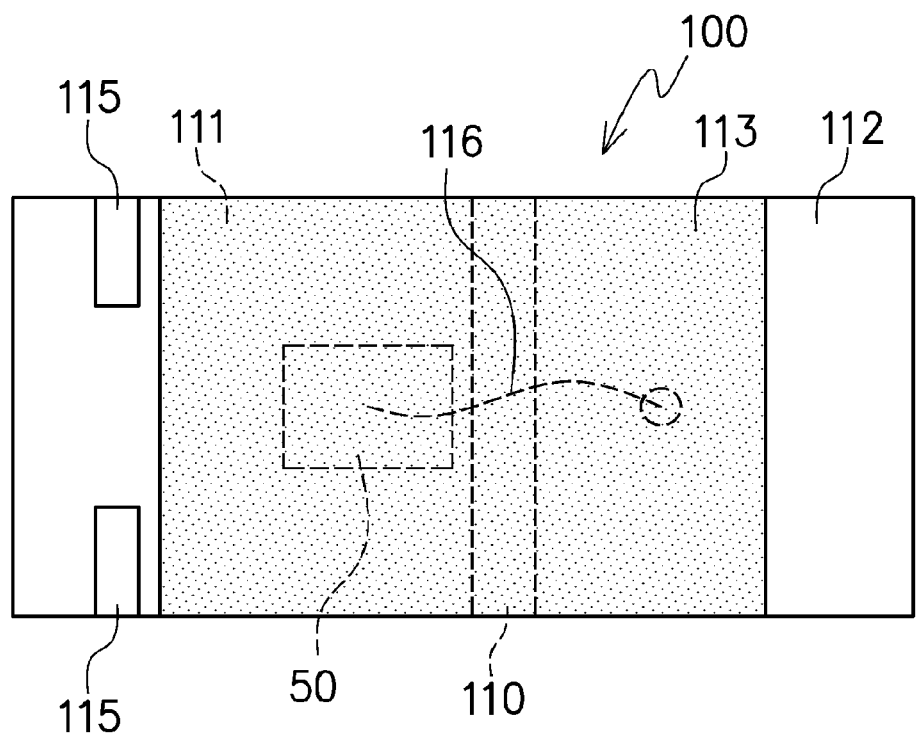
FIG. 14 is a top plan view illustrating the light-emitting device of FIG. 13.
Figure 15:
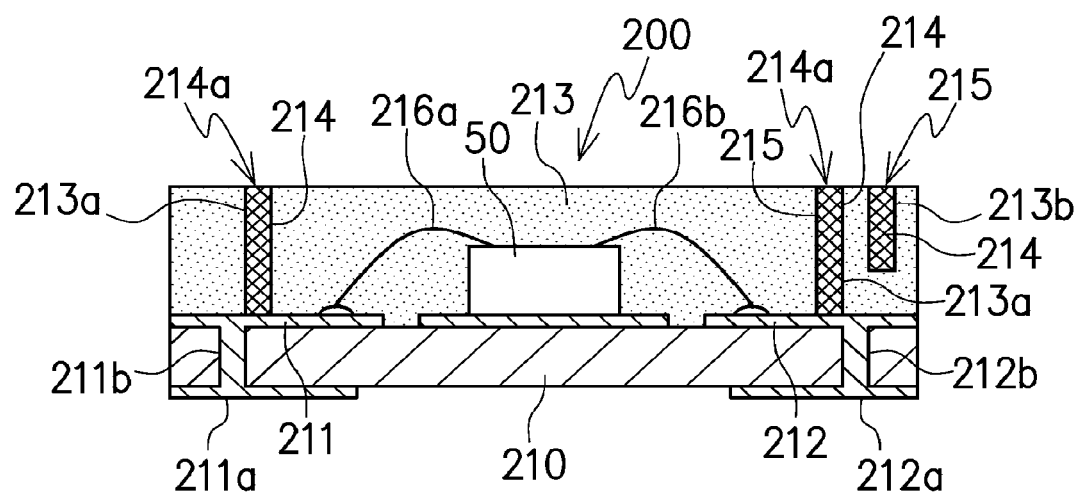
FIG. 15 is a cross-sectional view illustrating another light-emitting device according to a conventional technique.

This manufacturing method is basically the same as the manufacturing method shown in FIGS. 5A to 5E except that in the first resin filling step shown in FIG. 12B, the white resin as the first resin 4 seals the side surfaces 1e and the lower surface 1d of the light-emitting element 1 and at the same time, the first resin 4 fills in the groove 3a of the phosphor plate assembly 3L. The manufacturing method of this embodiment includes: disposing a white resin 4 on the lower surface 3Ld of the phosphor plate assembly 3L to cover a peripheral side surface 1e and a lower surface 1d of each of the light-emitting elements 1 with a pair of element electrodes 1a, 1b of each of the light-emitting elements 1 partly appearing from the white resin 4 to form an aggregation 30L and to fill the white resin 4 into the grooves 3a in the phosphor plate assembly 3L included in the aggregation 30L; and dicing the aggregation 30L between each of the light-emitting elements 1 to divide the aggregation 30L into a plurality of light emitting devices 30.

In this manufacturing method, the first resin filling step of FIG. 5C can be eliminated when manufacturing the light-emitting device 30, thereby providing improved productivity.

As described above, the present invention is configured such that the light emission surface of a light-emitting element is adhered onto a phosphor plate provided with a groove, and a second resin is filled in the groove of the phosphor plate at a position which can be viewed from the upper surface of the phosphor plate. While reducing the light-emitting device in size, this makes it possible to manufacture, through only a few additional manufacturing steps, the light-emitting device which enables the position of the element electrodes or the anode electrode and the cathode electrode to be instantly identified. In particular, this is significantly advantageous from a manufacturing viewpoint in a method for manufacturing a light-emitting device using a large phosphor plate assembly. Furthermore, although the second resin to be filled in the groove of the phosphor plate can have a color that is easily identifiable, the white resin as the first resin for covering the side surfaces of the light-emitting element can also be filled in the groove, in the case of which the manufacturing process is significantly simplified.

Furthermore, the groove 3b of the light-emitting device 20 according to the second embodiment is the concave groove that is provided on the upper surface of the phosphor plate 3, and thus the phosphor plate 3 can maintain the hermeticity of the light-emitting element 1 in the light-emitting device 20.

Furthermore, each embodiment employs a phosphor plate that is larger in shape than the light emission surface of the light-emitting element; however, the invention is not limited thereto. As a matter of course, it is also acceptable to form the phosphor plate, which is provided near a corner with a groove filled with the second resin, in the same shape as that of the light emission surface of the light-emitting element. The side surfaces of the light-emitting element and the side surfaces of the phosphor plate are flush with each other and can be covered with the white resin.

What is claimed is:

1. A light-emitting device comprising:
   a light-emitting element including an upper surface, a lower surface opposite to the upper surface, a peripheral side surface extending between peripheral edges of the upper surface and peripheral edges of the lower surface, and a pair of element electrodes as a first element electrode and a second element electrode that are positioned at the lower surface opposite to the upper surface of the light-emitting element;
   a first resin covering the peripheral side surface and the lower surface of the light-emitting element with the first element electrode and the second element electrode of the light-emitting element partly appearing from the first resin;
   a phosphor plate including an upper surface, a lower surface opposite to the upper surface, a peripheral side surface extending between peripheral edges of the upper surface and peripheral edges of the lower surface, and a groove positioned along one of the peripheral edges of the upper surface of the phosphor plate;
   a second resin filled in the groove of the phosphor plate; and
   the lower surface of the phosphor plate being adhered to the upper surface of the light-emitting element.

2. The light-emitting device according to claim 1:
the first resin is white resin.

3. The light-emitting device according to claim 2:
the second resin is white resin that is a same material as the first resin.

4. The light-emitting device according to claim 1:
the second resin is made from a resin of different color from the first resin.

5. The light-emitting device according to claim 1:
the groove is positioned adjacent to one of the pair of element electrodes of the light-emitting element in a top plan view.

6. The light-emitting device according to claim 1:
wherein the groove passes through the phosphor plate from the upper surface to the lower surface of the phosphor plate.

7. The light-emitting device according to claim 1:
wherein the groove is a line concave groove cut into the phosphor plate from the upper surface to a middle of the phosphor plate.

8. The light-emitting device according to claim 1:
wherein the upper surface of the phosphor plate is larger than the upper surface of the light-emitting element.

9. The light-emitting device according to claim 1:
wherein the peripheral side surface of the phosphor plate is flush with a peripheral side surface of the first resin.

10. The light-emitting device according to claim 1:
wherein the groove is positioned above the first resin.

11. The light-emitting device according to claim 1:
wherein the light-emitting element is a light-emitting diode element.

12. A lighting device comprising:
the light-emitting device according to claim 1;
a motherboard including a pair of electrodes as a first electrode and a second electrode;
the first element electrode of the light-emitting element being electrically connected to the first electrode of the motherboard and the second element electrode of the light-emitting element being electrically connected to the second electrode of the motherboard.

* * * * *